United States Patent [19]

Echizen et al.

[11] Patent Number: 4,717,242

[45] Date of Patent: Jan. 5, 1988

[54] ILLUMINATION OPTICAL SYSTEM

[75] Inventors: Hiroshi Echizen, Tokyo; Takashi Omata, Yokosuka, both of Japan

[73] Assignee: Canon Kabushiki Kaisha, Tokyo, Japan

[21] Appl. No.: 810,754

[22] Filed: Dec. 19, 1985

[30] Foreign Application Priority Data

Dec. 22, 1984 [JP] Japan .................................. 59-271491

[51] Int. Cl.$^4$ .................. G02B 27/00; G02B 27/30
[52] U.S. Cl. ................................ 350/276 R; 362/268
[58] Field of Search ................ 350/276 R, 405, 415, 350/444, 479; 362/268, 32

[56] References Cited

U.S. PATENT DOCUMENTS

| | | | |
|---|---|---|---|
| 3,296,923 | 1/1967 | Miles | 362/268 |
| 4,497,013 | 1/1985 | Ohta | 362/268 |

*Primary Examiner*—John K. Corbin
*Assistant Examiner*—Loha Ben
*Attorney, Agent, or Firm*—Fitzpatrick, Cella, Harper & Scinto

[57] ABSTRACT

An illumination optical system having a light source for supplying a light beam to illuminate an object and a collimator lens system for collimating the light beam emitted from the light source, the collimator lens system being arranged such that, even if any ghost beam is produced from a lens surface of the collimator lens system, the intensity of the ghost beam per unit area on the object is suppressed to such degree that does not cause deterioration of resolution. For this purpose, in an embodiment of the invention, the lens surface of the collimator lens system is shaped in a specific manner so as to control the position at which the ghost beam is concentrated or to be concentrated.

6 Claims, 7 Drawing Figures

ILLUMINATION OPTICAL SYSTEM

FIELD OF THE INVENTION AND RELATED ART

This invention relates to an illumination optical system and, more particularly, to an illumination optical system for use in the manufacture of microcircuits such as integrated circuits, for photolithographically transferring a fine circuit pattern of a photomask onto a surface of a photoresist material applied to a substrate such as a semiconductor wafer.

In an illumination optical system employed in a photolithography technique for the manufacture of microcircuits, for irradiating a photomask (hereinafter simply "mask") with light so as to photolithographically transfer a fine circuit pattern of the mask onto the surface of a wafer, it is desired that the illumination optical system assures a uniform distribution of illuminance in order to maintain a high resolving power over the whole surface of the wafer. In illumination optical systems currently used in the manufacture of semiconductor devices, however, it is possible for a portion of a light beam incident on the surface of the mask (having a high reflection factor of an order of 60% or more because of its chromium coating) to be reflected by the mask surface toward a lens element of the illumination optical system and for the reflected light beam, after it is reflected again by the surface of the lens element, to be incident again on the mask surface thereby causing a ghost. Such a ghost beam will degrade the resolving power of the system. In addition to the above-described disadvantage of current illumination optical systems, there is also a possibility in existing illumination optical systems that the light beam emitted from a light source toward the mask is repeatedly reflected by the surfaces of the lens element of the illumination optical system and that the reflected light beam, when it is finally incident on the mask surface, causes a ghost.

If the intensity of such a ghost beam becomes greater than a predetermined level as compared with the intensity of the light beam regularly incident on the mask surface, an exceedingly uneven distribution of illuminance on the mask surface is produced. The uneven distribution of illuminance is directly transferred onto the wafer surface thus causing a "hot spot". The occurrence of such a "hot spot" directly results in fluctuation or variation in the width of line of a pattern transferred onto the wafer.

SUMMARY OF THE INVENTION

Accordingly a primary object of the present invention is to provide an illumination optical system which assures prevention of the occurrence of any hot spot due to a ghost beam.

It is another object of the present invention to provide an illumination optical system usable in a microcircuit manufacturing exposure apparatus, which system is effective to assure prevention of the occurrence of any hot spot due to a ghost beam, to thereby maintain a high resolving power.

Briefly, according to one preferred form of the present invention, to achieve these objectives, an illumination optical system is provided having a light source for supplying a light beam to illuminate an object, and a collimator lens systems for collimating the light beam emitted from the light source. The collimator lens system is arranged such that, even if ghost beam is produced from a lens surface of the collimator lens system, the intensity of the ghost beam per unit area on the object is suppressed to a degree that does not cause deterioration of resolution. For this purpose, in this embodiment, the lens surface of the collimator lens system is shaped in a specific manner so as to control the position at which the ghost beam is or will be concentrated.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
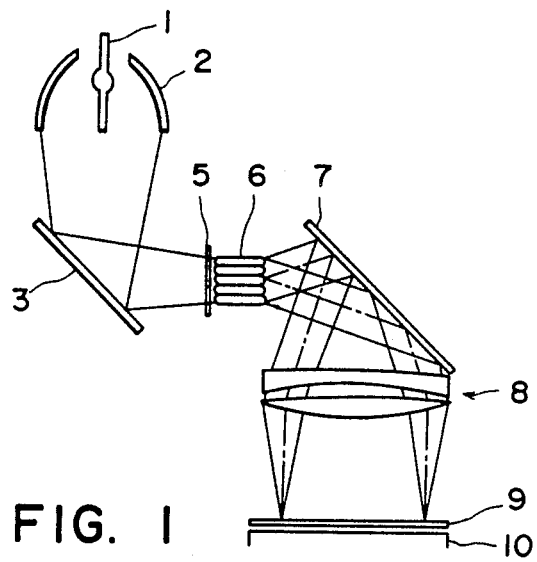
FIG. 1 is a schematic view of an illumination optical system according to an embodiment of the present invention.

Referring first to FIG. 1, there is schematically shown an illumination optical system according to one embodiment of the present invention. The illumination optical system includes a light source 1 and an elliptical mirror 2 for efficiently collecting light rays emitted from the light source 1. The elliptical mirror 2 has a first focal point and the light source 1 has its light-emitting point located in the vicinity of the first focal point of the elliptical mirror 2. The illumination optical system further includes a reflecting mirror 3, a shutter element for selectively blocking passage of the light from the mirror 3, and a multi-beam producing optical element 6 such as an optical integrator for defining a secondary light source providing a uniform distribution of light. The multi-beam producing optical element 6 is disposed in the neighborhood of a second focal point of the elliptical mirror 2. The illumination optical system still further includes another reflecting mirror 7 and a collimator lens system 8 which comprises two lens components and which is arranged (or shaped) so as to prevent the occurrence of an unwanted hot spot due to a ghost light.

The collimator lens system 8 cooperates with the multi-beam producing optical element 6 to thereby illuminate a mask 9 uniformly.

The multi-beam producing optical element 6 has its light-emitting surface disposed substantially at a front focal point of the collimator lens 8.

Denoted by numeral 10 is a semiconductor wafer which is held parallel to the mask 9 with a minute gap of the order of a few microns or tens of microns maintained therebetween.

In the FIG. 1 arrangement, the light beam emitted from the light source 1 is concentrated by the elliptical mirror 2 and is directed by means of the reflecting mirror 3 toward the multi-beam producing optical element 6. Thus, by virtue of the light beam incident on the multi-beam producing optical element 6, the secondary light source is defined at the light-emitting surface of the multi-beam producing optical element 6.

Since the secondary light source thus formed is located substantially at the front focal point position of the collimator lens system 8, each of light beams emitted from the multi-beam producing optical element 6 and incident on the collimator lens system 8 is collimated by the collimator lens system 8. The thus collimated light is incident on the mask 9 surface to illuminate the same. By the irradiation of the mask 9 with light, a circuit pattern formed on the mask 9 is transferred onto the surface of the wafer 10.

A first opportunity for the occurrence of the hot spot will now be described in detail with reference to FIGS. 2A and 2B.

Usually, the mask 9 is coated, by vacuum deposition, with a chromium material so that it has a high reflection factor of the order of 60%. Therefore, a portion of the illuminating light incident on the mask 9 will be reflected by the mask 9 surface toward the collimator lens system 8. Depending on the structure of the collimator lens system 8, it is possible for the light beam reflected from the mask 9 surface to be again reflected by one of the surfaces of the collimator lens system 8 toward the mask 9 surface, to thereby cause an uneven distribution of illuminance on the mask 9 surface. Such uneven distribution of illuminance would be directly transferred onto the wafer 10 surface. This is illustrated in FIGS. 2A and 2B. That is, FIGS. 2A and 2B schematically show examples of the path of the ghost beam defined by a light beam reflected from the mask 9 and by a lens surface R1 of the collimator lens system 8 and incident on the mask 9 surface. More particularly, FIG. 2A shows the case where a ghost beam is focused at a position S1 which is behind the mask 9, while FIG. 2B shows the case where a ghost beam is focused at a position S2 which is in front of the mask 9. It is seen from these Figures that there is a possibility for a hot spot to occur if the area of the mask 9 irradiated by the ghost beam is smaller than that of the mask 9 irradiated by the regular illuminating light (the light passed through the lens system 8).

Figure 2A:
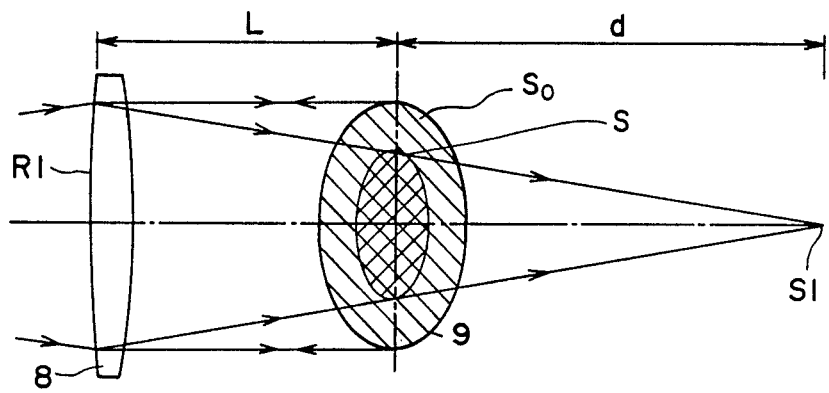
FIGS. 2A, 2B and 3 are schematic views, respectively, showing the occurrence of an unwanted hot spot.
Figure 2B:
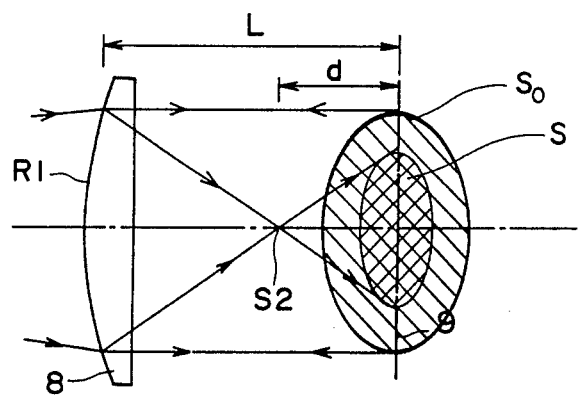
Figure 3:
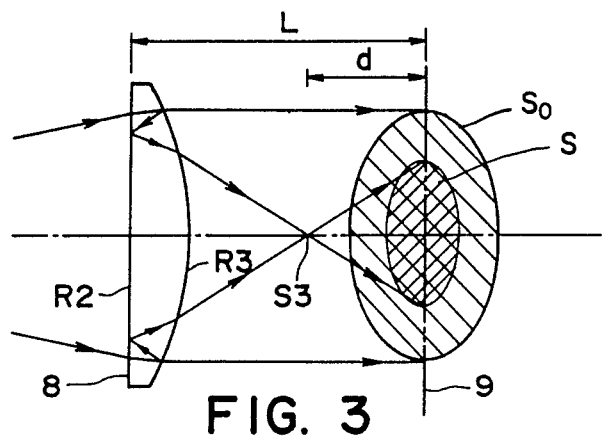

FIG. 3 shows another occasion for the occurrence of the hot spot, which is different from the cases shown in FIGS. 2A and 2B. In the case shown in FIG. 3, the light beam coming into the collimator lens system 8 is reflected by a lens surface R3 and then reflected again by another lens surface R2 and, thereafter, passes through the lens surface R3 to the mask 9. The ghost beam so produced is focused at a position S3 which is in front of the mask 9. In this manner, it is possible that the internal reflection or repeated reflection of the light beam within the lens element causes a ghost beam which leads to the occurrence of a hot spot. While, in the FIG. 3 example, the ghost beam is focused at a position in front of the mask 9, it is of course possible that, depending on the shapes of the lens surfaces of the collimator lens system 8, the ghost beam produced by the repeated reflection is focused at a position behind the mask 9, as in the case of FIG. 2A. Where the ghost beam is caused by repeated reflections at the internal surfaces of the lens element, the hot spot, which should be avoided, will be caused by a ghost beam that is produced by a light beam having been reflected twice by the internal surfaces of the lens element. This is because, if the light beam is reflected more than twice by the internal surfaces of the lens system, the absolute quantity of the ghost beam itself is reduced to such a degree that does not significantly degrade the resolution of the system.

Referring now to FIGS. 2A and 2B, the intensity of the hot spot formed on the mask 9 surface will now be calculated. This calculation is essentially applicable to the case of FIG. 3.

It is now assumed that the distance from the mask 9 to a lens surface R1 of the collimator lens system 8 (i.e. a lens surface participating in the formation of the ghost) is L; the distance from the mask 9 to a point at which the ghost beam is focused is d (taking the distance measured rightwards from the mask, as viewed in FIG. 2A or 2B, as being "positive"); the illuminance on the mask 9 surface defined by the regular illuminating light is $E_0$; the illuminance on the mask 9 surface defined by the ghost beam is E; the reflection factor of the mask 9 surface is $P_1$; the reflection factor of the lens surface R1 of the collimator lens system 8 is $P_2$; the area of the mask 9 as irradiated by the regular illuminating light is $S_0$; and the area of the mask 9 surface as irradiated by the ghost beam is S. To be exact, the value of L is not the distance between the mask 9 and the lens surface R1 of the collimator lens system 8, but the distance from the mask 9 surface to the intersection of the light beam reflected from the mask 9 with the ghost beam emerging from the lens 8 to the mask 9. As a matter of course, the aforesaid intersection is not a point at which these light beams actually intersect with each other, but a phantom point at which an extension of the light beam reflected from the mask surface and an extension of the ghost beam emerging from the lens system toward the mask 9 would intersect with each other. The reason why the distance from the mask 9 surface to the lens surface R1 of the collimator lens system 8 is taken as a practical value for L is that the distance therebetween is not so different from the real or theoretical value described above but is satisfactorily approximative to the theoretical value.

By using the foregoing symbols, the illuminance E on the mask 9 surface defined by the ghost beam can be expressed as follows:

$$E = P_1 \times P_2 \times (S_0/S) \times E_0 \qquad (1)$$

If the illuminance on the mask surface defined by the ghost beam in comparison with the illuminance on the mask surface defined by the regular illuminating light exceeds a certain threshold, the ghost beam causes a hot spot on the surface of the wafer. In view of this, the present invention is adapted to suppress the intensity of the ghost beam per unit area on the mask surface when a ghost beam having a certain intensity is incident on the mask surface, to thereby prevent formation of a hot spot on the surface of the wafer. In the present embodiment, for this purpose, the area of the mask surface to be irradiated by the ghost beam having a certain intensity is expanded as compared with the area of the mask surface irradiated by the ghost beam, having the same intensity, in a manner causing the hot spot.

From equation (1) set forth above, the ratio of the area S on the mask surface irradiated by the ghost beam relative to the area $S_0$ on the mask surface irradiated by the regular illuminating light can be expressed as follows:

$$S/S_0 = P_1 \times P_2 \times (E_0/E) \qquad (2)$$

-continued
$$= P_1 \times P_2/(E/E_0)$$

If the ratio of a tolerable maximum illuminance to be defined by a ghost beam relative to a certain illuminance to be defined by a regular illuminating light, with respect to prevention of occurrence of the hot spot, is denoted by m, such ratio can be expressed as follows:

$$m = E_{max}/E_0 \qquad (3)$$

If a ghost beam having a certain intensity is produced in response to irradiation by an illuminating light having a certain intensity, then it is necessary to satisfy the following condition in order to prevent the hot spot:

$$S/S_0 \geq P_1 \times P_2/m \qquad (4)$$

The condition (4) can be rewritten by using L and d. That is, from FIGS. 2A, 2B or 3, it is seen that $$S/S_0 = d^2/(L+d)^2 \qquad (4-1)$$

When equation (4-1) is substituted into the condition (4), then $$d^2/(L+d)^2 \geq P_1 \times P_2/m \qquad (4-2)$$

If d is positive, it follows from the condition (4-2) that $$d/(L+d) \geq \sqrt{(P_1 \times P_2)/m} \qquad (4-3)$$

Assuming now that $$\sqrt{(P_1 \times P_2)/m} = C \qquad (4-4)$$

then the condition (4-3) can be rewritten as follows:

$$d/(L+d) \geq C \qquad (4-5)$$

It follows from this that $$d \geq C(L+d)$$

$$\therefore (1-C)d \geq CL \qquad (4-6)$$

Since $S < S_0$ as seen from FIGS. 2A, 2B and 3, then $$(P_1 \times P_2/m) < 1$$

$$\therefore C < 1 \qquad (4-7)$$

From conditions (4-6) and (4-7), it follows that $$d \geq CL/(1-C) \qquad (4-8)$$

On the other hand, if d is negative, it follows from the condition (4-2) that $$d/(L+d) \leq -\sqrt{(P_1 \times P_2)/m} \qquad (4-9)$$

Using equation (4-4), $$d/(L+d) \leq -C \qquad (4-10)$$

It follows from this that $$d \leq -C(L+d)$$

$$\therefore (1+C)d \leq -CL$$

$$\therefore d \leq -CL/(1+C) \qquad (4-11)$$

It is seen from the foregoing that, in order to prevent the occurrence of a hot spot, the following relation should be satisfied:

$$\left.\begin{array}{l} d \geq CL/(1-C) \\ \text{or} \\ d \leq -CL/(1+C) \\ \text{wherein } C = \sqrt{(P_1 \times P_2)/m} \end{array}\right\} \qquad (5)$$

If, for example, m=0.005, $P_1$=0.6 and $P_2$=0.003, it follows from the relation (5) that $$\left.\begin{array}{l} d \geq 1.5L \\ \text{or} \\ d \leq -0.375L \end{array}\right\} \qquad (6)$$

The relation (5) and the derivation therefor set forth above are applicable to the FIG. 3 case. If, for example, the lens surface of the collimator lens system has a reflection factor of 2% and m=0.005, it follows from the relation (5) that $$\left.\begin{array}{l} d \geq L/2.5 \\ \text{or} \\ d \leq -L/4.5 \end{array}\right\} \qquad (7)$$

Of course, $P_1$ and $P_2$ in the relation (5), in this case, are the reflection factors of the surfaces R3 and R2 of the lens system 8, respectively.

The ratio m=0.005 is a value which will be admitted in a case where a fluctuation or variation in the line width (of a transferred pattern) of an order of 0.25% is tolerated.

In accordance with this embodiment of the present invention, as will be understood from the foregoing, the shape of the collimator lens system is set so as to satisfy, if m=0.005 is desired, the above-described relation (6) to prevent the occurrence of a hot spot in an embodiment such as is shown in FIG. 2A or 2B, and also, or alternatively, to satisfy the above-described relation (7) to prevent the occurrence of a hot spot in an embodiment such as is shown in FIG. 3.

Figure 4:
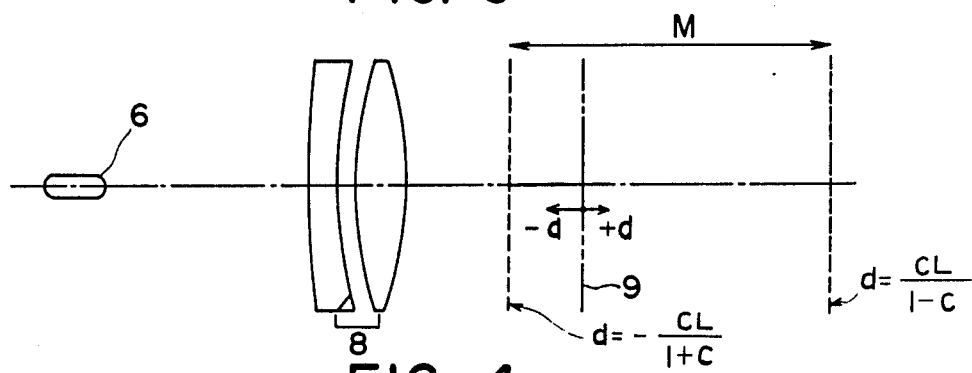
FIGS. 4 and 5 are schematic views, respectively, showing prohibition ranges for preventing the occurrence of an unwanted hot spot, in relation to a collimator lens system used in the illumination optical system according to an embodiment of the present invention.
Figure 5:
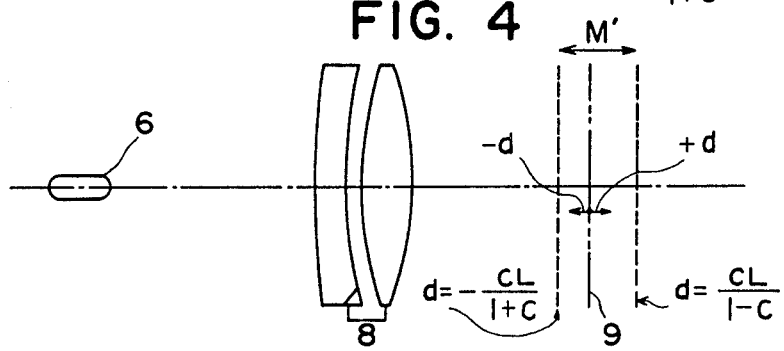

Referring now to FIGS. 4 and 5, details of the collimator lens system 8 shown in FIG. 1 will be described.

As shown in these Figures, the collimator lens system 8 is composed of two lens elements, i.e. a first lens element of a meniscus type having a negative refracting power and having a convex surface facing the secondary light source 6 and a second lens element of a biconvex type disposed at the image field side of the first lens element. Such two-component arrangement of the collimator lens system is employed so as to efficiently realize, with a minimum number of lens elements, the relation (5) as set forth above while assuring satisfactory optical performance as a collimator.

More particularly, in order to prevent the occurrence of a hot spot due to any light beam reflected from the mask 9 surface and reflected by one of the lens surfaces, the collimator lens system is arranged such that the ghost beam is not focused at a position adjacent to the mask 9. More specifically, the ghost beam is not focused at a position within a prohibition range M (FIG. 4) which is greater than "$d = -CL/(1+C)$" and smaller than "$d = CL/(1-C)$". Also, in order to prevent the occurrence of a hot spot due to any light beam reflected by two of the lens surfaces, the collimator lens system is arranged such that the ghost beam is not focused at a position in close proximity to the mask 9. More specifically, the ghost beam is not focused at a position within another prohibition range M' (FIG. 5) which is greater than "$d = -CL/(1+C)$" and smaller than "$d = CL/(1-C)$". With such arrangement, the ghost beam produced from each of the lens surfaces of the collimator lens is prevented from being focused at a position in the neighborhood of the mask 9. Consequently the occurrence of a hot spot is effectively prevented.

Further, in order to prevent the occurrence of a hot spot while simultaneously attaining a superior optical performance as a collimator, it is preferable that the two-component collimator lens system described as above satisfies the following relations:

$$0.25f \leq L \leq 3f \quad (8)$$

$$1.1 \leq R1/f \leq 2.3 \quad (9)$$

$$0.65 \leq R2/f \leq 0.93 \quad (10)$$

$$0.85 \leq R3/f \leq 1.42 \quad (11)$$

$$0.47 \leq |R4/f| \leq 0.85 \quad (12)$$

wherein f is the focal length of the collimator lens; L is the distance between the collimator lens and the surface of the mask; Ri is the radius of curvature of the "i-th" lens surface of the collimator lens in an order from the secondary light source side.

The relation (8) is a condition necessary for keeping an appropriate distance between the collimator lens and the mask surface, to thereby make the illumination optical system compact, while assuring superior optical performance of the illumination optical system. If the upper or lower limit of the condition (8) is exceeded, it becomes difficult to assure the optical performance of the illuminating device while maintaining the compactness of the entire illuminating device.

The relations (9)–(12) are conditions necessary for setting, under the conditions (8), the refracting power of each of the lens surfaces of the first and second lens components of the collimator lens system and for avoiding or suppressing the occurrence of a hot spot due to the reflection at the mask 9 surface and/or the repeated reflections within the collimator lens system.

When using a collimator lens system, it is necessary to specify the lens thickness, the air spacing between adjacent lens surfaces, the refractive index of the glass used and the like, in addition to the above-specified conditions (8)–(12). However, it is practically possible to prevent the occurrence of a hot spot while assuring satisfactory correction of aberrations of the lens system, if the refracting powers of the lens surfaces of the collimator lens system are determined so as to satisfy the above-described conditions, because they are most contributory to the suppression of the hot spot.

Numerical data on two examples of a collimator lens system usable in an illumination optical system according to the present invention will be shown in the following examples. In the numerical data which follows, Ri denotes the radius of curvature of the "i-th" surface of the collimator lens system in an order from the light source side; Di denotes the lens thickness or the air spacing, measured on the optical axis, between the "i-th" surface and the "(i+1)-th" surface of the collimator lens system; and Ni denotes the refractive index of the "i-th" lens component of the collimator lens system.

EXAMPLE 1

| (For $m = E_{max}/E_0 = 0.005$) | | |
|---|---|---|
| R1 = 443 (mm) | D1 = 12.6 (mm) | N1 = 1.53 |
| R2 = 245 | D2 = 21.0 | |
| R3 = 385 | D3 = 45.0 | N2 = 1.53 |
| R4 = −200 | | |

| L = 0.38 − 0.60f |
|---|
| R1/f = 1.26 |
| R2/f = 0.70 |
| R3/f = 1.10 |
| \|R4/f\| = 0.63 |

The spacing between the optical element 6 and the collimator lens system 8 as measured on the optical axis = 290 mm.

The spacing between the collimator lens system 8 and the mask 9 surface as measured on the optical axis = 132 mm.

The allowable value of d to avoid the prohibition range M (FIG. 4):

$$d \geq 198, \text{ or}$$

$$d \leq -49.5$$

The allowable value of d to avoid the prohibition range M' (FIG. 5):

$$d \geq 52.8, \text{ or}$$

$$d \leq -29.3$$

| FOCUS POSITION OF GHOST BEAM IN EXAMPLE 1 | | | | |
|---|---|---|---|---|
| REFLEX. SURFACE | | REFLEX. FACTOR | | |
| 1ST | 2ND | $P_1$ | $P_2$ | FOCUS POSITION |
| mask | R1 | 0.6 | 0.003 | −80 |
| mask | R2 | 0.6 | 0.003 | −111 |
| mask | R3 | 0.6 | 0.003 | −80 |
| mask | R4 | 0.6 | 0.003 | −240 |
| R4 | R3 | 0.02 | 0.02 | −123 |
| R4 | R2 | 0.02 | 0.02 | −163 |
| R4 | R1 | 0.02 | 0.02 | −182 |
| R3 | R2 | 0.02 | 0.02 | +104 |

EXAMPLE 2

| (For $m = E_{max}/E_0 = 0.005$) | | |
|---|---|---|
| R1 = 440 (mm) | D1 = 10 (mm) | N1 = 1.53 |
| R2 = 250 | D2 = 18 | |
| R3 = 200 | D3 = 40 | N2 = 1.53 |
| R4 = −600 | | |

| L = 0.35 − 0.52f |
|---|
| R1/f = 1.15 |
| R2/f = 0.66 |
| R3/f = 0.52 |
| \|R4/f\| = 1.57 |

The spacing between the optical element 6 and the collimator lens system 8 as measured on the optical axis = 290 mm.

The spacing between the collimator lens system 8 and the mask 9 surface as measured on the optical axis = 132 mm.

The allowable value of d to avoid the prohibition range M (FIG. 4):

$d \geqq 198$, or $d \leqq -49.5$

The allowable value of d to avoid the prohibition range M' (FIG. 5):

$d \geqq 52.8$, or $d \leqq -29.3$

| FOCUS POSITION OF GHOST BEAM IN EXAMPLE 2 | | | | |
|---|---|---|---|---|
| REFLEX. SURFACE | | REFLEX. FACTOR | | |
| 1ST | 2ND | $P_1$ | $P_2$ | FOCUS POSITION |
| mask | R1 | 0.6 | 0.003 | −69 |
| mask | R2 | 0.6 | 0.003 | −108 |
| mask | R3 | 0.6 | 0.003 | −103 |
| mask | R4 | 0.6 | 0.003 | −∞ |
| R4 | R3 | 0.02 | 0.02 | −114 |
| R4 | R2 | 0.02 | 0.02 | −130 |
| R4 | R1 | 0.02 | 0.02 | −146 |
| R3 | R2 | 0.02 | 0.02 | +868 |
| R3 | R1 | 0.02 | 0.02 | −594 |
| R2 | R1 | 0.02 | 0.02 | −490 |

It was confirmed that the collimator lens system of Example 1 assured sufficient suppression of occurrence of a hot spot while attaining superior optical performance as a collimator. On the other hand, the collimator lens system of Example 2, although it achieved satisfactory prevention of the occurrence of a hot spot, was slightly inferior to the collimator lens system of Example 1 from the perspective of the correction of aberrations. This is because in Example 2 the conditions (11) and (12) set forth in the foregoing are not satisfied.

Figure 6:
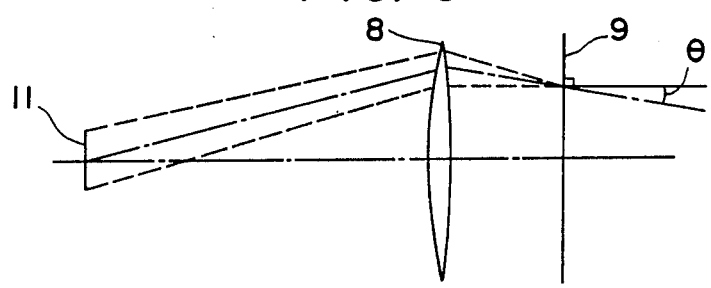
FIG. 6 is a schematic view for illustrating the optical function of a collimator lens system.

The above-described two-component collimator lens system 8 is adapted to cooperate with the multi-beam generating optical element 6 to form a superior parallel light. In an alignment and exposure apparatus of the proximity type in which the mask surface and the wafer surface are maintained out of contact with each other, such as is shown in FIG. 1, and if the angle θ defined between the normal to the mask 9 surface and the light beam divergingly emitted from the center of the secondary light source 11 (see FIG. 6) is large (hereinafter the angle θ will be referred to as the "inclination angle of the principal ray"), an image formed on the wafer 9 surface would be distorted. For this reason, it is very important to design the collimator lens system so as to make the inclination angle θ of the principal ray as small as possible. Such inclination angle of the principal ray is definitely determined by the spherical aberration and the focal length of the collimator lens system 8 and by the distance between the secondary light source 11 and the collimator lens system 8. In the two-component collimator lens system according to the above-described embodiment of the present invention, it is easy to assure prevention of a hot spot while achieving a superior optical performance as a collimator. This will be apparent particularly from the Example 1 set forth above.

As a light source portion of the illumination optical system, a secondary light source may be provided at a position of the focal surface of the collimator lens system 8, such as shown in FIG. 1, or alternatively the light source 1 itself may be disposed at the focal surface of the collimator lens system 8. As a further alternative, the multi-beam generating optical element used in the FIG. 1 embodiment may be omitted and, in place thereof, a condenser lens may be disposed to receive the light beam from the light source 1 and to form a secondary light source at a position of the focal surface of the collimator lens system 8.

The number of the multi-beam generating optical element is not limited to "one", and two such elements may be used to form the secondary light source at the focal surface of the collimator lens system, such as is described in U.S. Pat. No. 4,497,013. As described in the foregoing, the light source means to be disposed at one focal surface of the collimator lens system may be directly provided by an illumination source or may be provided by a secondary light source.

While the invention has been described with reference to the structures disclosed herein, it is not confined to the details set forth and this application is intended to cover such modifications or changes as may come within the purposes of the improvements or the scope of the following claims.

What is claimed is:

1. An illumination optical system for irradiating an object with a light beam, said system comprising:
   a light source portion for supplying a light beam; and
   a collimator lens system for receiving the light beam from said light source portion and for irradiating the object with the light beam passed through said collimator lens system, said collimator lens system having a focal point and being disposed so that the focal point thereof is positioned substantially at said light source portion, said collimator lens system also having a surface at least partially reflecting, toward the object, a light beam reflected from the object irradiated with the light beam passed through said collimator lens system, said surface of said collimator lens system having a shape which satisfies the following relation:

$S/S_0 \geqq P_1 \times P_2/m$ $m = E_{max}/E_0$ wherein S is the area on the object as irradiated by the light beam reflected from said surface of said collimator lens system, $S_0$ is the area on the object as irradiated by the light beam passed through said collimator lens system, $P_1$ is the reflection factor of the surface of the object, $P_2$ is the reflection factor of said surface of said collimator lens system, Emax is an allowable maximum illuminance on the object as defined by the light beam reflected from said surface of said collimator lens system, $E_0$ is the illuminance on the object as defined by the light beam passed through said collimator lens system, and m is the ratio Emax to E0.

2. A system according to claim 1, wherein said light source portion includes a light source for producing a light beam and optical means for receiving the light beam from said light source and for forming a secondary light source.

3. A system according to claim 1, wherein said collimator lens system includes, in an order from said light source portion to the object, a first lens component of meniscus type having a negative refracting power and having a convex surface facing to said light source portion and a second lens component of biconvex type.

4. An illumination optical system for irradiating an object with a light beam, said system comprising:
a light source portion for supplying a light beam; and
a collimator lens system for receiving the light beam from said light source portion and for irradiating the object with the light beam passed through said collimator lens system, said collimator lens system having a focal point and being disposed so that the focal point thereof is positioned substantially at said light source portion, said collimator lens system also having a first surface and a second surface, said first surface of said collimator lens system at least partially reflecting toward said second surface, the light beam supplied from said light source portion and incident on said collimator lens system, said second surface of said collimator lens system at least partially reflecting, toward the object, the light beam reflected from said first surface of said collimator lens system, and said second surface of said collimator lens system having a shape which satisfies the following relation:

$$S/S_0 \geqq P_1 \times P_2/m$$

$$m = E_{max}/E_0$$

wherein S is the area on the object as irradiated by the light beam reflected by said first and second surfaces of said collimator lens system, $S_0$ is the area on the object as irradiated by the light beam passed through said collimator lens system without reflection, $P_1$ is the reflection factor of said first surface of said collimator lens system, $P_2$ is the reflection factor of said second surface of said collimator lens systems, Emax is an allowable maximum illuminance on the object as defined by the light beam reflected by said first and second surfaces of said collimator lens system, $E_0$ is the illuminance on the object as defined by the light beam passed through said collimator lens system without reflection, and m is the ratio of Emax to E0.

5. A system according to claim 4, wherein said light source portion includes a light source for producing a light beam and optical means for receiving the light beam from said light source and for forming a secondary light source.

6. A system according to claim 4, wherein said collimator lens system includes, in an order from said light source portion to the object, a first lens component of meniscus type having a negative refracting power and having a convex surface facing to said light source portion and a second lens component of biconvex type.

* * * * *

UNITED STATES PATENT AND TRADEMARK OFFICE
CERTIFICATE OF CORRECTION

PATENT NO. : 4,717,242

DATED : January 5, 1988

INVENTOR(S) : HIROSHI ECHIZEN, ET AL.

It is certified that error appears in the above-identified patent and that said Letters Patent is hereby corrected as shown below:

COLUMN 1

Line 52, "Accordingly" should read --Accordingly,--.

COLUMN 2

Line 41, "shutter element" should read --shutter element 5--.

COLUMN 7

Line 66, "tribritory" should read --tributory--.

COLUMN 9

Line 56, "wafer 9" should read --wafer 10--.

COLUMN 10

Line 65, "E0." should read --$E_0$.--.

UNITED STATES PATENT AND TRADEMARK OFFICE
CERTIFICATE OF CORRECTION

PATENT NO. : 4,717,242

DATED : January 5, 1988

INVENTOR(S) : HIROSHI ECHIZEN, ET AL.

It is certified that error appears in the above-identified patent and that said Letters Patent is hereby corrected as shown below:

COLUMN 12

Line 18, "E0." should read --$E_0$.--.

Signed and Sealed this

Nineteenth Day of July, 1988

Attest:

DONALD J. QUIGG

*Attesting Officer*  *Commissioner of Patents and Trademarks*